(12) United States Patent
Park et al.

(10) Patent No.: US 12,048,231 B2
(45) Date of Patent: Jul. 23, 2024

(54) DISPLAY DEVICE

(71) Applicant: Samsung Display Co., Ltd., Yongin-Si (KR)

(72) Inventors: Cheuljin Park, Seoul (KR); Hyunchul Bae, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 658 days.

(21) Appl. No.: 17/142,665

(22) Filed: Jan. 6, 2021

(65) Prior Publication Data

US 2021/0320283 A1  Oct. 14, 2021

(30) Foreign Application Priority Data

Apr. 10, 2020  (KR) .................. 10-2020-0044282

(51) Int. Cl.
| | |
|---|---|
| *H10K 71/00* | (2023.01) |
| *H01L 25/18* | (2023.01) |
| *H10K 50/844* | (2023.01) |
| *H10K 59/12* | (2023.01) |
| *H10K 77/10* | (2023.01) |
| *H10K 102/00* | (2023.01) |

(52) U.S. Cl.
CPC ............ *H10K 71/00* (2023.02); *H01L 25/18* (2013.01); *H10K 50/844* (2023.02); *H10K 59/12* (2023.02); *H10K 77/111* (2023.02); *H10K 2102/311* (2023.02)

(58) Field of Classification Search
CPC ...... H10K 71/00; H10K 50/844; H10K 59/12; H10K 77/111; H10K 2102/311; H10K 50/8426; H10K 50/115; G02F 1/1347; G02F 1/1339; H01L 25/18; G09F 9/301
See application file for complete search history.

(56) References Cited

U.S. PATENT DOCUMENTS

| | | | |
|---|---|---|---|
| 10,165,715 B2 | 12/2018 | Choi et al. | |
| 10,288,974 B2 | 5/2019 | Hou et al. | |
| 2018/0366679 A1* | 12/2018 | Kim | ............ B32B 27/10 |
| 2019/0006615 A1* | 1/2019 | Jung | ............ H10K 50/87 |
| 2019/0043420 A1* | 2/2019 | Jung | ............ H10K 59/65 |
| 2019/0310302 A1* | 10/2019 | Lee | ............ G06F 3/0443 |
| 2019/0339741 A1* | 11/2019 | Park | ............ H10K 50/125 |
| 2020/0022261 A1* | 1/2020 | Choi | ............ H10K 59/131 |
| 2020/0171787 A1 | 6/2020 | Lim et al. | |

FOREIGN PATENT DOCUMENTS

| | | |
|---|---|---|
| KR | 1020180068382 A | 6/2018 |
| KR | 101917266 B1 | 11/2018 |

* cited by examiner

*Primary Examiner* — Kevin Quarterman
(74) *Attorney, Agent, or Firm* — CANTOR COLBURN LLP

(57) ABSTRACT

A display device includes a display panel including a first area, a second area disposed on the first area, and a bending area extending from the first area to the second area, where the first area includes a first flat area and a first curved area disposed between the bending area and the first flat area, a driver disposed on the first flat area, a cover panel disposed between the first area and the second area, and a space layer including a first adhesive layer disposed between the cover panel and the first curved area and a second adhesive layer disposed between the cover panel and the first flat area. Here, the first adhesive layer has an adhesive property different from an adhesive property of the second adhesive layer.

12 Claims, 14 Drawing Sheets

FIG. 9A
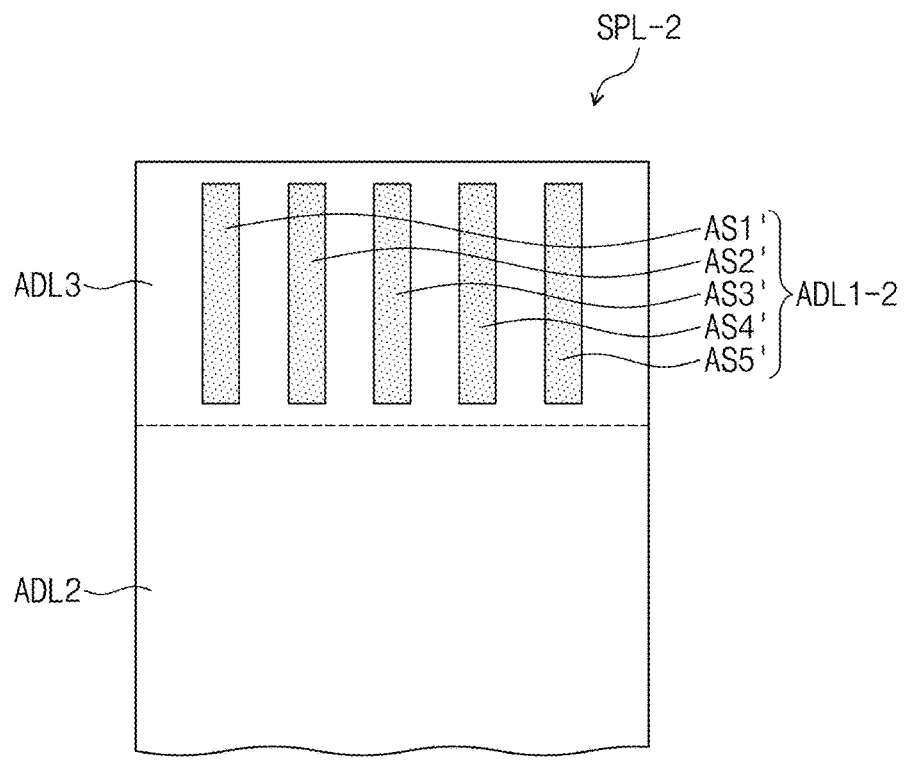
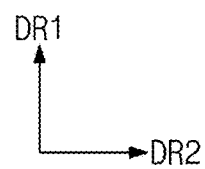
FIG. 9B
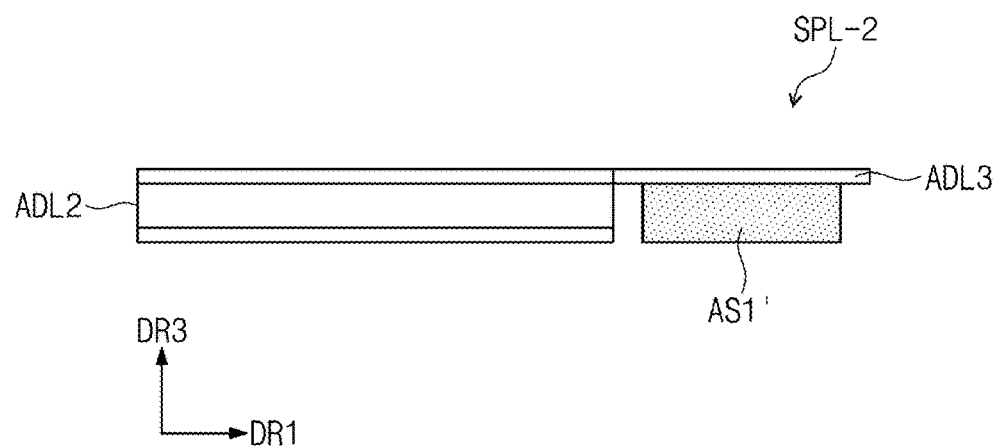

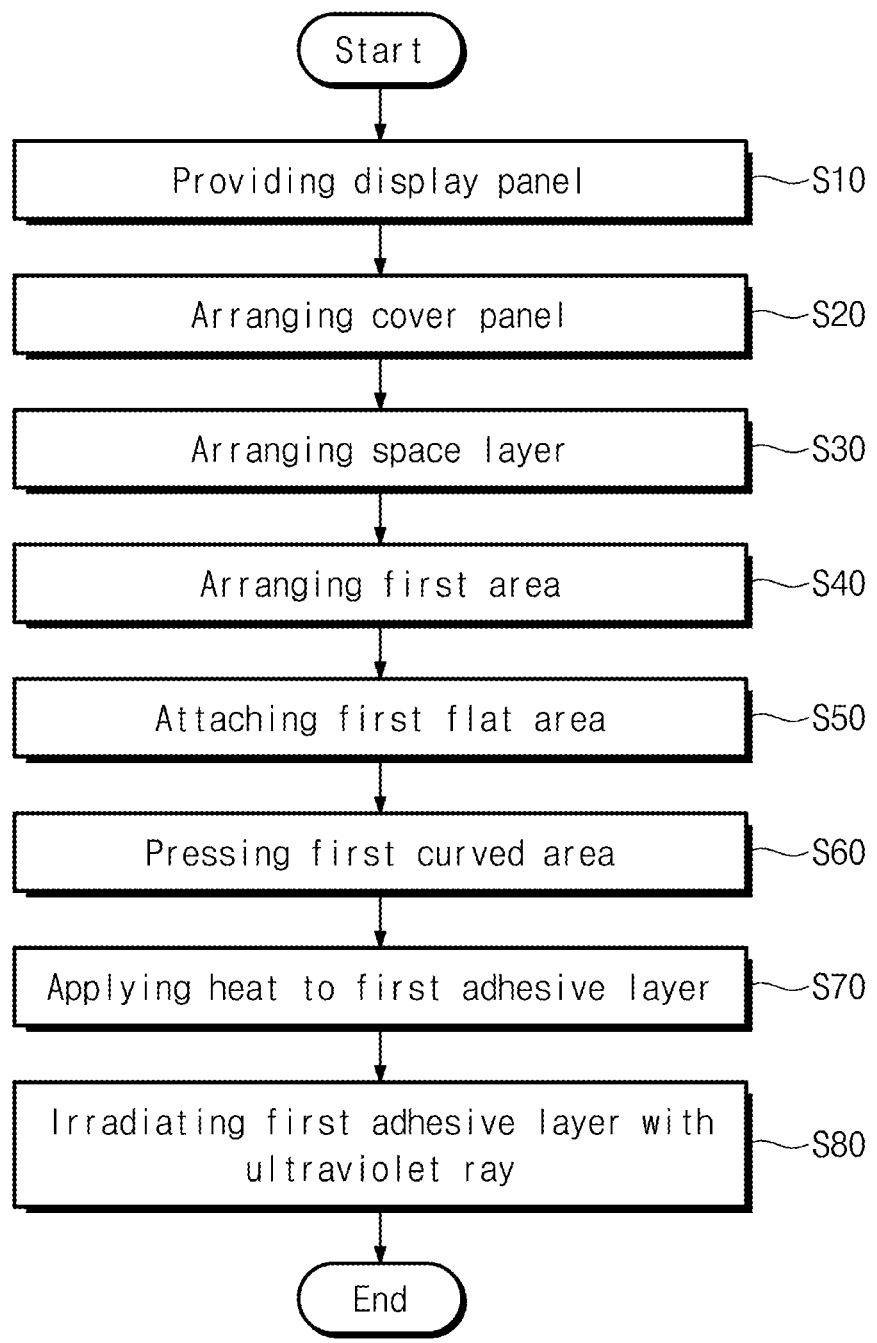

DISPLAY DEVICE

This application claims priority to Korean Patent Application No. 10-2020-0044282, filed on Apr. 10, 2020, and all the benefits accruing therefrom under 35 U.S.C. § 119, the content of which in its entirety is herein incorporated by reference.

BACKGROUND

The present disclosure herein relates to a display device.

Various display devices used for a multimedia device such as televisions, mobile phones, tablet computers, navigation units, and game consoles have been developed. Each display device may include a display panel for displaying an image, an input sensing panel for sensing an external input, and a window.

Various types of display devices have been developed in addition to a flat display device. For example, various flexible display devices such as a curved display device, a bendable display device, a foldable display device, a rollable display device, and a stretchable display device have been developed.

SUMMARY

The present disclosure provides a display device capable of stably fixing a portion of a display panel, which is disposed in a curved area, to a cover panel.

An embodiment of the inventive concept provides a display device including: a display panel including a first area, a second area disposed on the first area, and a bending area extending from the first area to the second area, where the first area includes a first flat area and a first curved area disposed between the bending area and the first flat area; a driver disposed on the first flat area; a cover panel disposed between the first area and the second area; and a space layer including a first adhesive layer disposed between the cover panel and the first curved area and a second adhesive layer disposed between the cover panel and the first flat area. Here, the first adhesive layer has an adhesive property different from an adhesive property of the second adhesive layer.

In an embodiment of the inventive concept, a method for manufacturing a display device includes: providing a display panel including a first area, a second area, and a bending area extending from the first area to the second area, where the first area includes a first curved area and a first flat area; arranging a cover panel on a bottom surface of the second area; arranging a space layer including a first adhesive layer and a second adhesive layer on a bottom surface of the cover panel; and arranging the first area on a bottom surface of the space layer by bending the bending area. Here, the first adhesive layer is disposed between the first curved area and the cover panel, the second adhesive layer is disposed between the first flat area and the cover panel, and the first adhesive layer has an adhesive property different from an adhesive property of the second adhesive layer.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIGS. 9A to 9B are views illustrating a space layer of the display device according to an embodiment of the inventive concept;

FIG. 10 is a flowchart representing a method of manufacturing the display panel according to an embodiment of the inventive concept.

DETAILED DESCRIPTION

Figure 1:
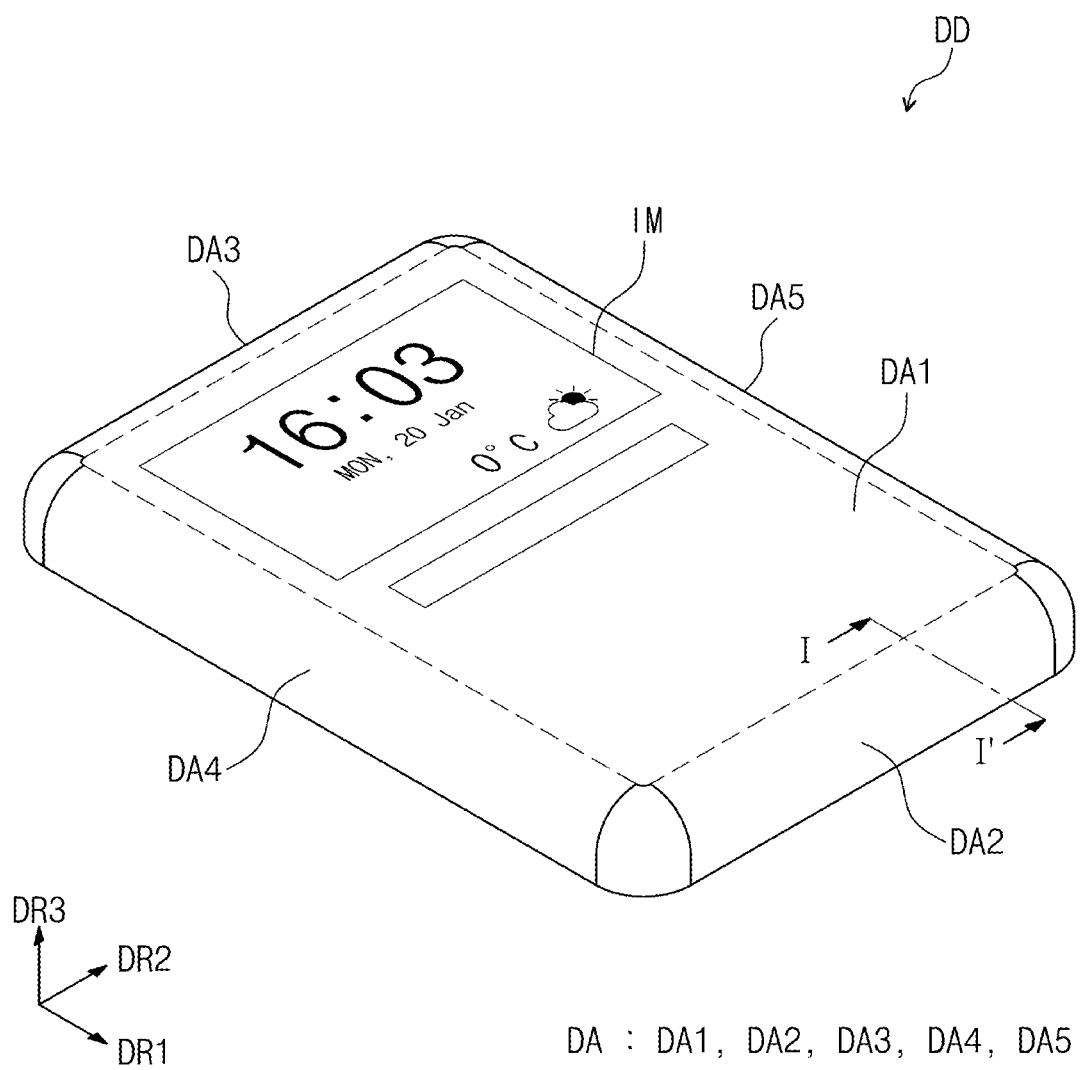
FIG. 1 is a perspective view illustrating a display device according to an embodiment of the inventive concept.

In this specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, ""under", "below", "above', "upper", and the like are used for explaining relation association of components illustrated in the drawings. The terms may be a relative concept and described based on directions expressed in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a fixed number, a step, an operation, an element, a component or a combination thereof, but does not exclude other properties, fixed numbers, steps, operations, elements, components or combinations thereof.

Hereinafter, embodiments of the inventive concept will be described in detail with reference to the accompanying drawings.

FIG. 1 is a perspective view illustrating a display device according to an embodiment of the inventive concept.

Referring to FIG. 1, a display device DD according to an embodiment of the inventive concept may have long sides extending in a first direction DR1 and short sides extending in a second direction DR2 crossing the first direction DR1. The display device DD may have four edges (i.e., long and short sides) each having a curved shape. However, the embodiment of the inventive concept is not limited to the shape of the display device DD shown in FIG. 1. In another embodiment, the display device DD may have various shapes such as a circular shape or a polygonal shape when viewed from a plane.

Hereinafter, a direction that crosses a plane defined by the first and second directions DR1 and DR2 in a substantially perpendicular manner is defined as a third direction DR3. The third direction DR3 is referred as a thickness direction of the display device DD in another name. Hereinafter, a feature of "when viewed from a plane" (i.e., plan view) represents a shape viewed in the third direction DR3.

The display device DD may include a display area DA and a non-display area (not shown). The non-display area may be disposed along an edge of the display area DA. The display area DA may display an image, and the non-display area may not display an image. The non-display area may define a bezel of the display device DD.

The display area DA may include a first display area DA1, a second display area DA2, a third display area DA3, a fourth display area DA4, and a fifth display area DA5. The first display area DA1 may be a flat display area. For example, the first display area DA1 may have long sides extending in the first direction DR1 and short sides extending in the second direction DR2.

Each of the second to fifth display areas DA2, DA3, DA4, and DA5 may be a curved display area. The second display area DA2 may extend from one short side of the first display area DA1 in the first direction DR1. The second display area DA2 may be gradually bent in a downward direction (e.g., the third direction DR3) along a direction away from the one short side of the first display area DA1 (i.e., the first direction DR1). The third display area DA3 may be disposed at a position opposite to the second display area DA2 with respect to the first display area DA1.

The fourth display area DA4 may extend from one long side of the first display area DA1 in the second direction DR2. The fourth display area DA4 may be gradually bent in a downward direction (e.g., the third direction DR3) along a direction away from the one long side of the first display area DA1 (i.e., the second direction DR2). The fifth display area DA5 may be disposed at a position opposite to the fourth display area DA4 with respect to the first display area DA1.

According to an embodiment of the inventive concept, the display device DD may provide, to a user, an image IM generated through the curved second to fifth display areas DA2, DA3, DA4, and DA5 extending from the flat first display area DA1.

The display device DD according to an embodiment of the inventive concept may provide a wider display screen to the user by including the curved display areas.

Figure 2:
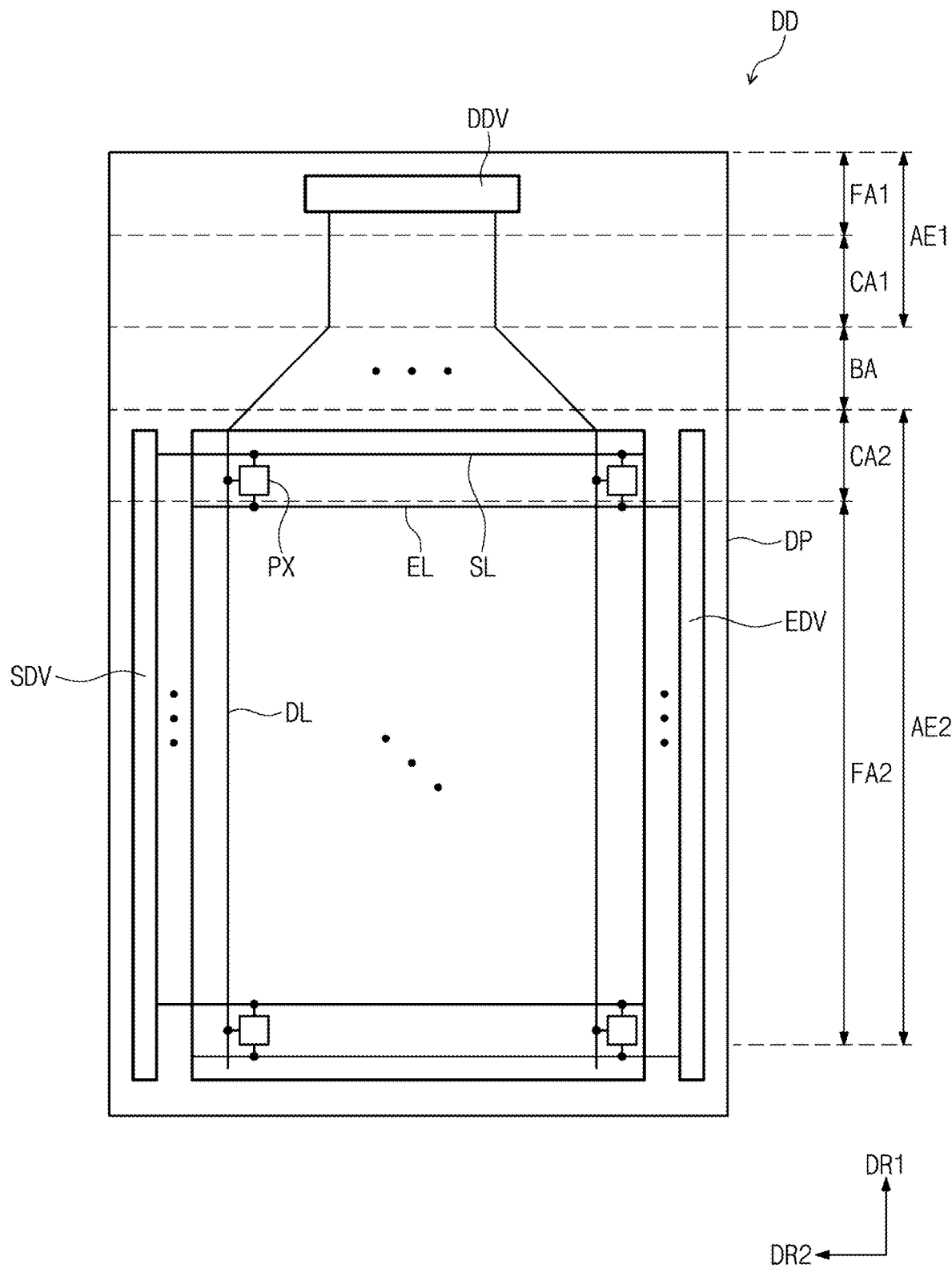
FIG. 2 is a plan view illustrating an embodiment of the display device in FIG. 1.

FIG. 2 is a plan view illustrating an embodiment of the display device in FIG. 1. FIG. 2 illustrates a state in which a bending area BA of a display panel DP is unfolded for convenience of description.

Referring to FIG. 2, the display device DD according to an embodiment of the inventive concept may include a display panel DP, a scan driver SDV, a data driver DDV, and an emission driver EDV.

The display panel DP may be a flexible display panel. For example, the display panel DP may include a plurality of electronic elements disposed on the flexible substrate. The display panel DP may have a rectangular shape having long sides extending in the first direction DR1 and short sides extending in the second direction DR2.

The display panel DP may include a first area AE1, a second area AE2, and a bending area BA. The second area AE2, the bending area BA and the first area AE1 may be sequentially arranged in the first direction DR1.

The first area AE1 may be a non-display area that does not display an image. The first area AE1 may include a first flat area FA1 and a first curved area CA1. The data driver DDV may be mounted in the first flat area FA1.

The second area AE2 may include a display area that displays an image. The second area AE2 may include a second flat area FA2 and a second curved area CA2. The second flat area FA2 may correspond to the first display area DA1 in FIG. 1. The second curved area CA2 may correspond to the second display area DA2 in FIG. 1.

The bending area BA may extend from the first area AE1 to the second area AE2. The bending area BA may be bent in a process of manufacturing the display device DD. As the bending area BA is bent, the first area AE1 may be disposed below the second area AE2. This will be described later.

The display panel DP may include a plurality of pixels PX, a plurality of scan lines SL, a plurality of data lines DL, and a plurality of emission lines EL. Although the pixels PX may be arranged in a matrix form, the embodiment of the inventive concept is not limited thereto. For example, the pixels PX may be arranged in various forms. The pixels PX may be disposed on the display area and connected to the scan lines SL, the data lines DL, and the emission lines EL. For example, the pixels PX may be disposed on the second flat area FA2 and the second curved area CA2 of the second area AE2. Thus, as the pixels PX are arranged even on the second curved area CA2, the display device DD may have the curved second display area DA2 (refer to FIG. 1).

The scan driver SDV and the emission driver EDV may be disposed at an edge of the display panel DP. For example, the scan driver SDV and the emission driver EDV may be disposed at edges, which are opposite to each other in the second direction DR2, of the display panel DP. The scan driver SDV and the emission driver EDV may be disposed on the non-display area. In other words, the scan driver SDV and the emission driver EDV may be disposed on a bezel area.

The data driver DDV may be manufactured as an integrated circuit chip and disposed in the first flat area FA1 of the first area AE1. The data driver DDV may be disposed below the display panel DP when the bending area BA is bent.

The scan lines SL may extend in the second direction DR2 and be connected to the scan driver SDV and the pixels PX. The emission lines EL may extend in the second direction DR2 and be connected to the emission driver EDV and the pixels PX.

The data lines DL may extend in the first direction DR1. Specifically, the data lines DL may be disposed on the second area AE2, the bending area BA, and the first area AE1. The data lines DL may extend from the second area AE2 and connected to the data driver DDV disposed on the first area AE1 through the bending area BA.

The scan driver SDV may generate a plurality of scan signals, and the scan signals may be applied to the pixels PX through the scan lines SL. The scan signals may be sequentially applied to the pixels PX. The data driver DDV may generate a plurality of data voltages, and the data voltages may be applied to the pixels PX through the data lines DL. The emission driver EDV may generate a plurality of emission signals, and the emission signals may be applied to the pixels PX through the emission lines EL.

Although not shown, the display device DD may include a timing controller (not shown) for controlling an operation of each of the scan driver SDV, the data driver DDV, and the emission driver EDV.

The timing controller may generate a scan control signal, a data control signal, and an emission control signal in response to control signals received from the outside. The timing controller may receive image signals from the outside and convert a data format of the image signals in accordance with an interface specification with the data driver DDV to provide the image signals to the data driver DDV.

The scan driver SDV may generate scan signals in response to the scan control signal, and the emission driver EDV may generate emission signals in response to the emission control signal. The data driver DDV may receive the image signals having the converted data format and generate data voltages corresponding to the image signals in response to the data control signal.

The pixels PX may receive the data voltages in response to the scan signals. The pixels PX may display an image by emitting light having luminance corresponding to the data voltages in response to the emission signals. The pixels PX may have an emission time that is controlled by the emission signals.

Figure 3:
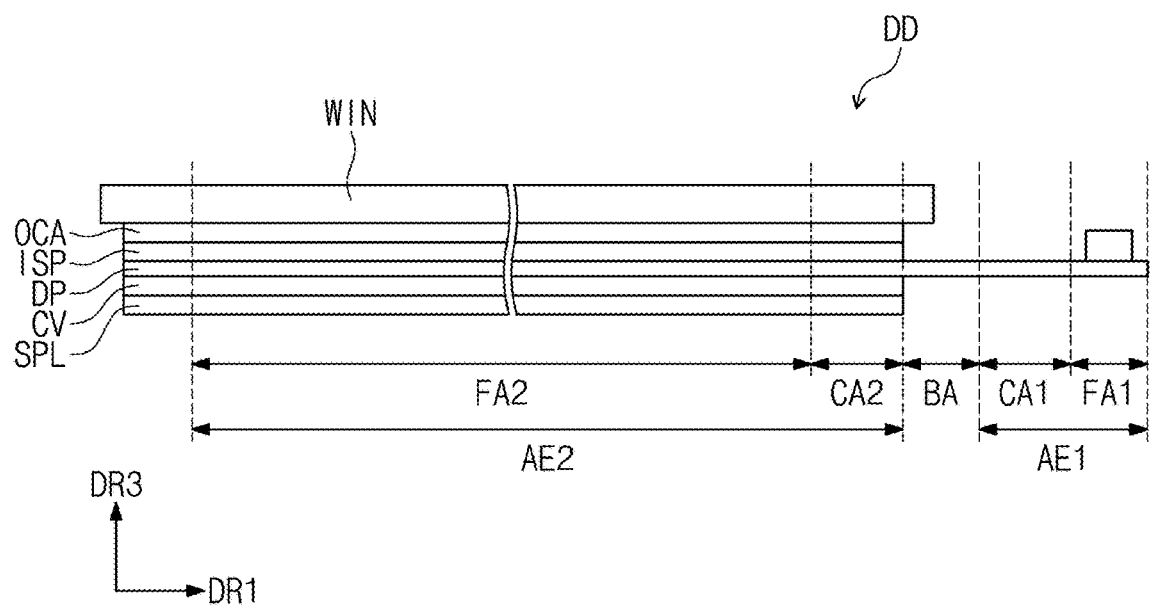
FIG. 3 is a cross-sectional view illustrating an embodiment of the display device in FIG. 1.
Figure 4:
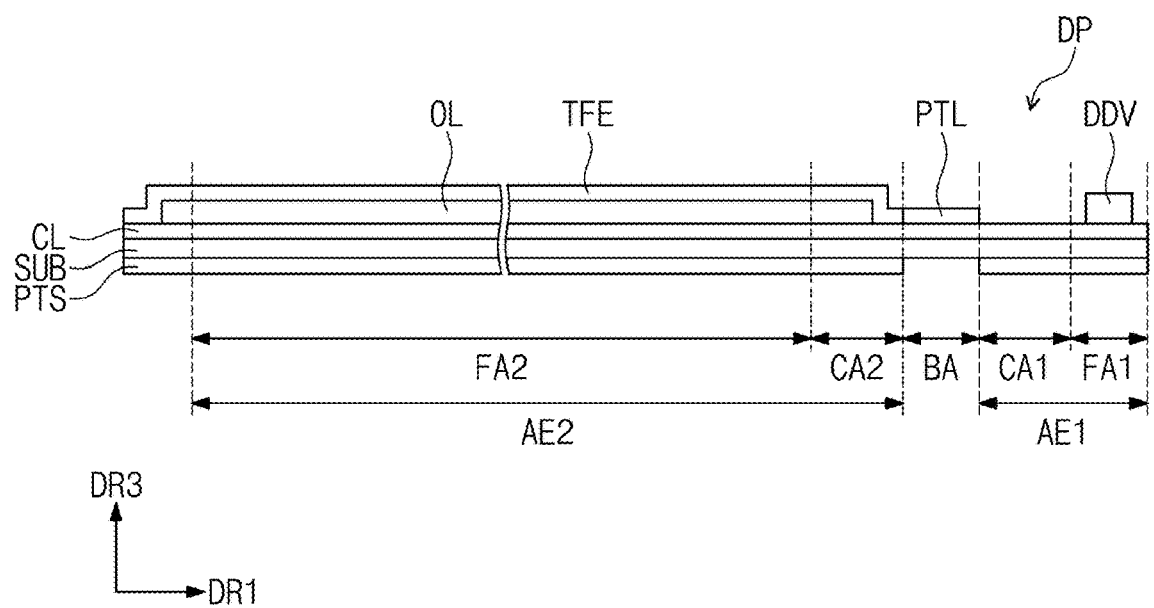
FIG. 4 is a cross-sectional view illustrating an embodiment of a display panel in FIG. 3.
Figure 5:
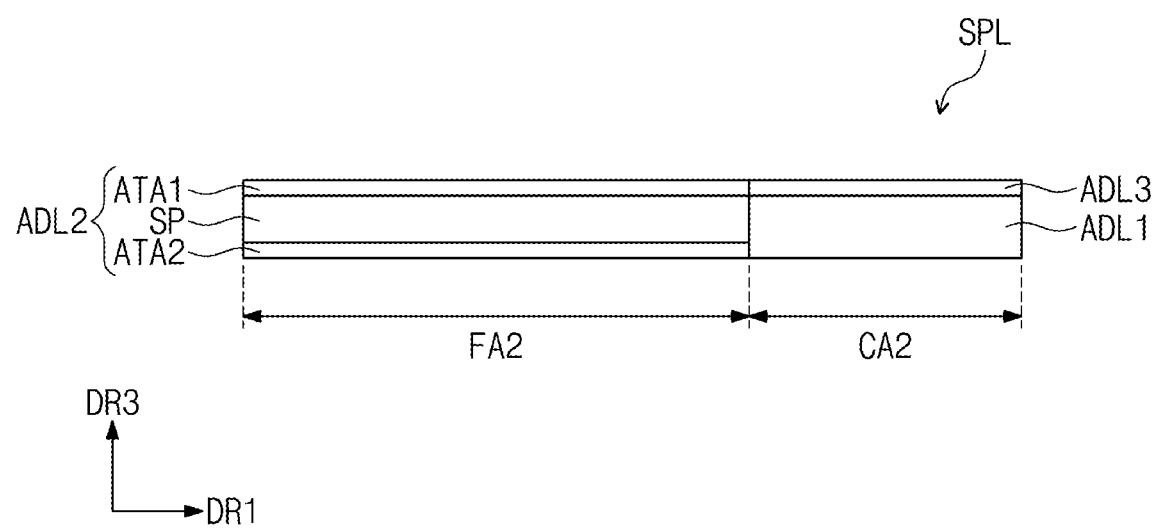
FIG. 5 is a cross-sectional view illustrating an embodiment of a space layer in FIG. 3.

FIG. 3 is a cross-sectional view illustrating an embodiment of the display device in FIG. 1. FIG. 4 is a cross-sectional view illustrating an embodiment of a display panel in FIG. 3. FIG. 5 is a cross-sectional view illustrating an embodiment of a space layer in FIG. 3. FIGS. 3 to 5 illustrate a state when each of layers of the display device DD is not bent for convenience of description.

Referring to FIGS. 3 to 5, the display device DD may include a display panel DP, and input sensing part ISP, a window WIN, a cover panel CV, and a space layer SPL.

The display panel DP according to an embodiment of the inventive concept may be a light emitting display panel. However, the embodiment of the inventive concept is not limited thereto. For example, the display panel DP may be an organic light emitting display panel or a quantum dot light emitting display panel. The organic light emitting display panel may include a light emitting layer containing an organic light emitting material. The quantum dot light emitting display panel may include a light emitting layer containing a quantum dot or a quantum rod. Hereinafter, the display panel DP will be described as the organic light emitting display panel.

The display panel DP may include a substrate SUB, a circuit element layer CL disposed on the substrate SUB, a display element layer OL disposed on the circuit element layer CL, a thin-film encapsulation layer TFE disposed on the display element layer OL, and a protection substrate PTS disposed below the substrate SUB (refer to FIG. 4). Although not shown, the display panel DP may further include functional layers such as an anti-reflection layer and a refractive index adjusting layer.

The substrate SUB that is a transparent substrate may include a flexible plastic substrate. For example, the substrate SUB may include transparent polyimide ("PI"). The substrate SUB may include a first area AE1, a second area AE2, and a bending area BA disposed between the first area AE1 and the second area AE2 like the display panel DP. Specifically, the substrate SUB may include a first flat area FA1 and a first curved area CA1 of the first area AE1, a second flat area FA2 and a second curved area CA2 of the second area AE2, and the bending area BA.

The circuit element layer CL may be disposed on the substrate SUB. The circuit element layer CL may be disposed on the first area AE1, the second area AE2, and the bending area BA of the substrate SUB. The circuit element layer CL may include at least one insulation layer and a circuit element. The insulation layer may include at least one inorganic layer and at least one organic layer. The circuit element may include a signal line and a driving circuit of a pixel. For example, the circuit element may include scan lines SL, the emission lines EL, and the data lines DL in FIG. 2.

The display element layer OL may be disposed on the circuit element layer CL. The display element layer OL may overlap the second flat area FA2 and the second curved area CA2 of the second area AE2 in a plan view. In other words, the display element layer OL may overlap the display area that realizes an image. The display element layer OL may include a light emitting element. For example, the display element layer OL may include organic light emitting diodes. The display element layer OL may further include an organic layer such as a pixel defining layer.

The thin-film encapsulation layer TFE may be disposed on the display element layer OL to seal the display element layer OL. The thin-film encapsulation layer TFE may overlap the second area AE2. The thin-film encapsulation layer TFE includes at least one insulation layer. For example, the thin-film encapsulation layer TFE may include at least one inorganic layer and at least one organic layer. The inorganic layer may include a silicon nitride layer, a silicon oxynitride layer, a silicon oxide layer, or a titanium oxide layer. The inorganic layer may protect the display element layer OL from moisture/oxygen. The organic layer may include an acrylic-based organic layer. The organic layer may protect the display element layer OL from foreign substances such as dust particles.

The protection substrate PTS may protect a lower portion of the substrate SUB. The protection substrate PTS may be disposed below the substrate SUB in the first area AE1 and the second area AE2. The protection substrate PTS may not be disposed below the substrate SUB in the bending area BA. The protection substrate PTS may include a flexible plastic substrate. For example, the protection substrate PTS may include colored polyimide.

The display panel DP may further include a protection layer PTL. The protection layer PTL may be disposed on the bending area BA. The protection layer PTL may be disposed adjacent to the thin-film encapsulation layer TFE. The protection layer PTL may have flexibility. For example, the protection layer PTL may be bent in conjunction with the bending area BA as the bending area BA is bent. The protection layer PTL may protect the circuit element layer CL disposed in the bending area BA.

The input sensing part ISP may be disposed on the display panel DP. Specifically, the input sensing part ISP may be disposed on the second area AE2 of the display panel DP. The input sensing part ISP may sense an external input such as a touch of the user, convert the external input into an input signal, and provide the input signal to the display panel DP. The input sensing part ISP may include a plurality of sensors (not shown) for sensing an external input. The sensors may sense the external input in a capacitive method. The display panel DP may receive an input signal from the input sensing part ISP and generate an image corresponding to the input signal.

The window WIN may be disposed on the input sensing part ISP. The window WIN may overlap the second area AE2 and a portion of the bending area BA of the display panel DP. The window WIN may be disposed to cover the second area AE2 and a portion of the bending area BA. The window WIN may protect the display panel DP and the input sensing part ISP from external scratches and impacts. As illustrated in FIG. 3, an adhesive OCA may be disposed between the window WIN and the input sensing part ISP. The adhesive OCA may include an optical clear adhesive. The image generated from the display panel DP may pass through the window WIN and be provided to the user.

The cover panel CV may be disposed below the display panel DP. The cover panel CV may be disposed below the second area AE2 of the display panel DP. The cover panel CV may not be disposed below the first area AE1 and the bending area BA of the display panel DP. The cover panel CV may absorb an external impact applied to a lower portion of the display panel DP. For example, the cover panel CV may include a cushion layer. The cover panel CV may include a foam sheet having a predetermined elastic force.

The space layer SPL may be disposed below the cover panel CV. The space layer SPL may overlap the second area AE2 of the display panel DP. Specifically, the space layer SPL may include a first adhesive layer ADL1, a second adhesive layer ADL2, and a third adhesive layer ADL3 (refer to FIG. 5). The first adhesive layer ADL1 and the third adhesive layer ADL3 may be disposed below the second curved area CA2 of the second area AE2 of the display panel DP.

The third adhesive layer ADL3 may be a double-sided tape. The third adhesive layer ADL3 may have one surface attached to a bottom surface of the cover panel CV. The third adhesive layer ADL3 may have the other surface attached to a top surface of the first adhesive layer ADL1. The first adhesive layer ADL1 may be disposed below the third adhesive layer ADL3. Each of the first adhesive layer ADL1 and the third adhesive layer ADL3 may be deformable in correspondence to a shape of the second curved area CA2. In this application, a top surface and a bottom surface are determined based on a structure shown in FIG. 6.

The second adhesive layer ADL2 may be disposed below the second flat area FA2 of the second area AE2 of the display panel DP. The second adhesive layer ADL2 may include a first adhesive tape ATA1, a second adhesive tape ATA2, and a spacer SP disposed between the first adhesive tape ATA1 and the second adhesive tape ATA2. The first adhesive tape ATA1 may have one surface attached to the bottom surface of the cover panel CV. The spacer SP may have a top surface attached to the other surface of the first adhesive tape ATA1. The spacer SP may be plastic having flexibility. The second adhesive tape ATA2 may have one surface attached to a bottom surface of the spacer SP.

In terms of the third direction DR3, the second adhesive layer ADL2 may have a thickness that is equal to a sum of a thickness of the first adhesive layer ADL1 and a thickness of the third adhesive layer ADL3. The second adhesive layer ADL2 may be connected to the first adhesive layer ADL1 and the third adhesive layer ADL3. However, the embodiment of the inventive concept is not limited thereto. The second adhesive layer ADL2 may be spaced apart from the first adhesive layer ADL1 and the third adhesive layer ADL3 in the third direction DR3 in another embodiment.

The first adhesive layer ADL1 may have a property different from that of the second adhesive layer ADL2. The first adhesive layer ADL1 may have an adhesive force in a predetermined temperature range. For example, the first adhesive layer ADL1 may have an adhesive force in a first temperature range and may not have an adhesive force in a second temperature range. Here, minimum value in the first temperature range may be greater than a maximum value in the second temperature range. For example, the first temperature range may be about 70 degrees Celsius (° C.) to about 85° C., and the second temperature range may be about 15° C. to about 25° C. However, the embodiment of the inventive concept is not limited to the first temperature range and the second temperature range.

Specifically, the first adhesive layer ADL1 may include a thermoplastic resin. For example, the first adhesive layer ADL1 may include a hot-melt adhesive. The first adhesive layer ADL1 may not have the adhesive force in the second temperature range. The first adhesive layer ADL1 may be melted and have the adhesive force in the first temperature range. Once the first adhesive layer ADL1 is coupled with another member in the first temperature range, even though the temperature is reduced to an original temperature after the coupling, a coupling force between the first adhesive layer ADL1 and the member attached thereto may be maintained.

The second adhesive layer ADL2 may have the adhesive force in the first and second temperature ranges. For example, each of the first adhesive tape ATA1 and the second adhesive tape ATA2 of the second adhesive layer ADL2 may be an optically-clear adhesive. However, the embodiment of the inventive concept is not limited thereto. For example, each of the first adhesive tape ATA1 and the second adhesive tape ATA2 may be a colored adhesive in another embodiment.

Figure 6:
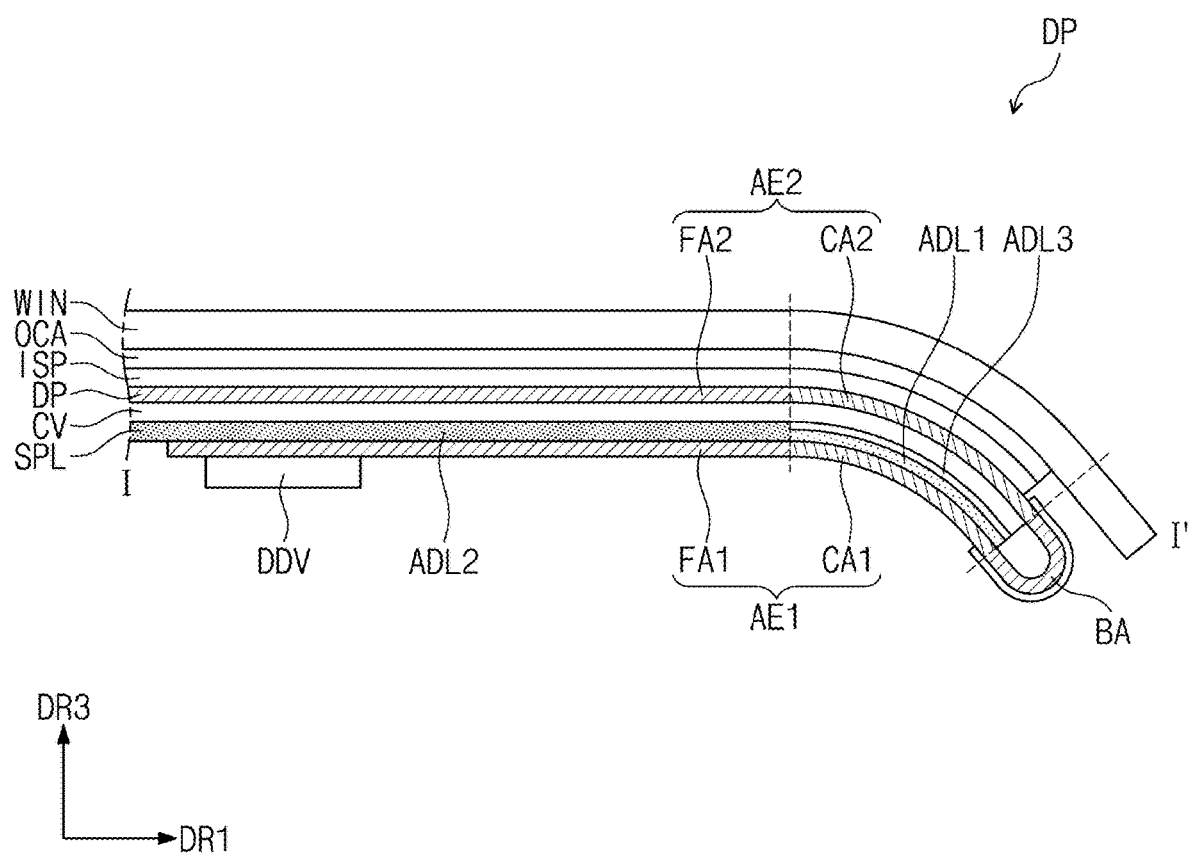
FIG. 6 is a view illustrating an embodiment of an internal structure of line I-I' in FIG. 1.
Figure 7:
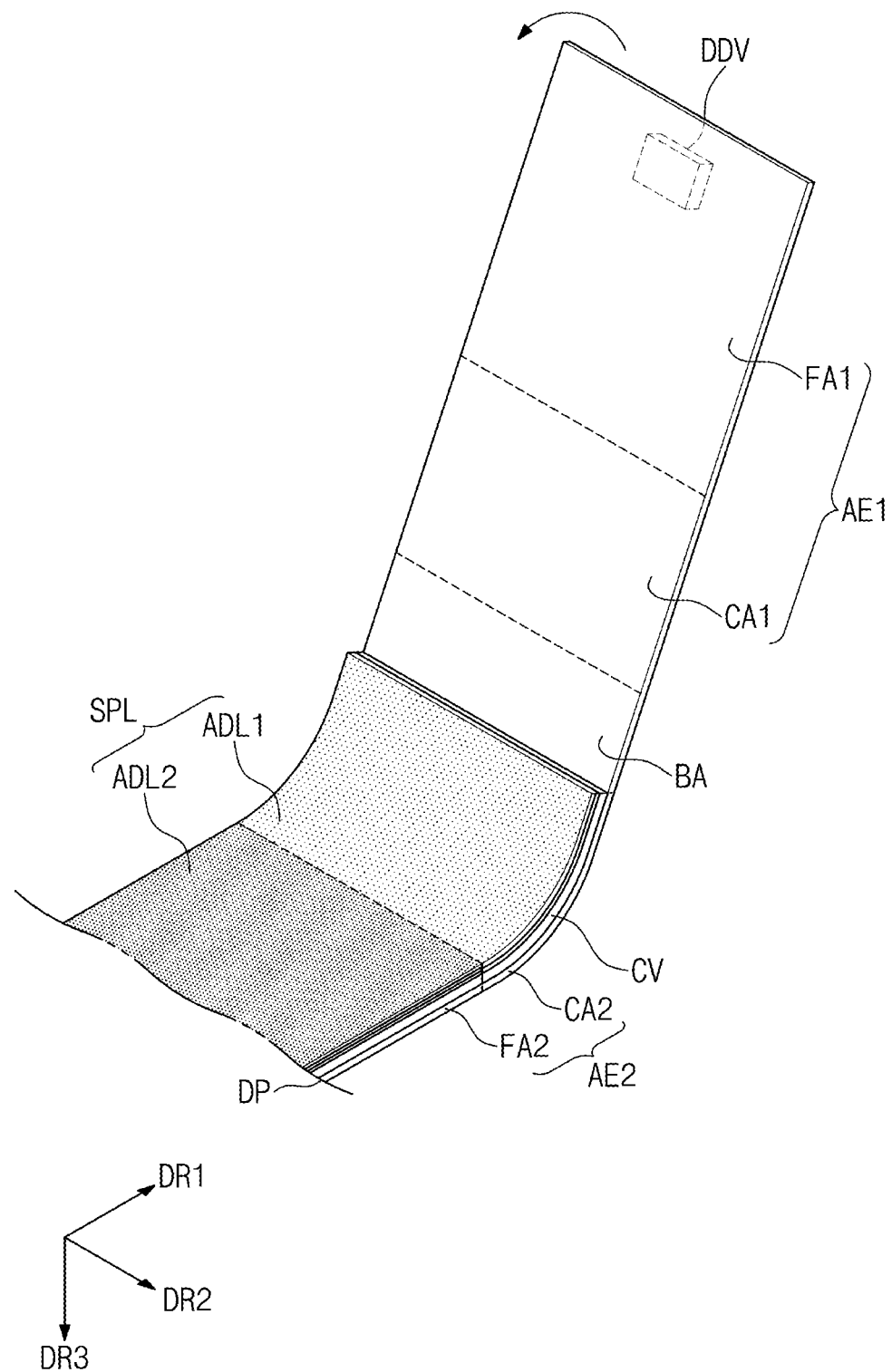
FIG. 7 is a view illustrating an embodiment of a state before a display panel in FIG. 6 is bent.

FIG. 6 is a view illustrating an embodiment of an internal structure of line I-I' in FIG. 1. FIG. 7 is a view illustrating an embodiment of a state before the display panel in FIG. 6 is bent. FIG. 7 illustrates that top and bottom surfaces of each of the display panel DP, the cover panel CV, and the space layer SPL are reversed, and the input sensing part and the window disposed on the display panel DP are omitted for convenience of description in FIG. 7.

Referring to FIGS. 6 and 7, the bending area BA of the display panel DP may be bent. The first area AE1 may be disposed below the space layer SPL in FIG. 6. Specifically, the first curved area CA1 of the first area AE1 of the display panel DP may be disposed below the first adhesive layer ADL1. The first curved area CA1 may have a top surface attached to a bottom surface of the first adhesive layer ADL1 in FIG. 6. The bottom surface of the first adhesive layer ADL1 faces the top surface of the first curved area CA1. A manufacturing method for attaching the first curved area CA1 to the first adhesive layer ADL1 will be described later.

The top surface of the first curved area CA1 may have the same area as the bottom surface of the first adhesive layer ADL1. The first curved area CA1 may be deformable in correspondence to a shape of the first adhesive layer ADL1. For example, the first curved area CA1 may have a curved shape in this state. When viewed from a plane (i.e., plan view), the first curved area CA1 may overlap the second curved area CA2.

The first flat area FA1 of the first area AE1 may be disposed below the second adhesive layer ADL2. The first flat area FA1 may have a top surface attached to a bottom surface of the second adhesive layer ADL2. The bottom surface of the second adhesive layer ADL2 faces the top surface of the first flat area FA1. The top surface of the first flat area FA1 may have the same area as the bottom surface of the second adhesive layer ADL2. When viewed from the plane, the first flat area FA1 may overlap the second flat area FA2.

According to an embodiment of the inventive concept, since the first adhesive layer ADL1 disposed between the cover panel CV and the first curved area CA1 has a property different from that of the second adhesive layer ADL2 disposed between the cover panel CV and the first flat area FA1, the first curved area CA1 may be stably fixed to the cover panel CV. The above-described particular effect of the embodiment of the inventive concept will be clearly understood when a manufacturing method of the display device is described.

Figure 8A:
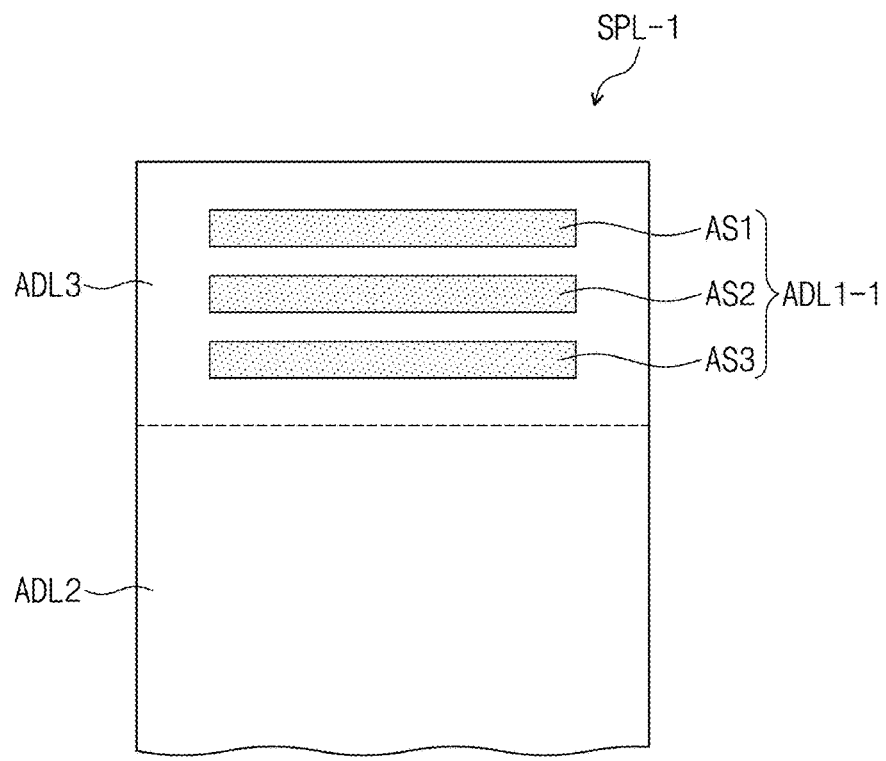
FIGS. 8A to 8B are views illustrating a space layer of the display device according to an embodiment of the inventive concept.

FIGS. 8A to 9B are views illustrating the space layer of the display device according to other embodiments of the inventive concept. Hereinafter, the display device includes a space layer different from that in the above-described embodiment, and other components of the display device except for the space layer are the same as those described in the above-described embodiment. In FIGS. 8A and 9A, a bottom surface of the space layer faces upward for convenience of description.

Figure 8B:
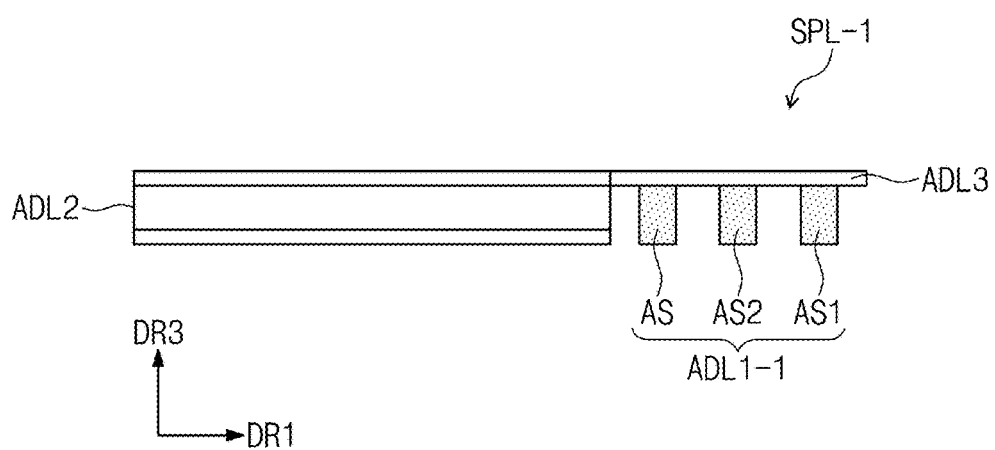

Referring to FIGS. 8A and 8B, a first adhesive layer ADL1-1 of a space layer SPL-1 may include a plurality of adhesive sheets AS1, AS2, and AS3. Each of a first adhesive sheet AS1, a second adhesive sheet AS2, and a third adhesive sheet AS3 may have an adhesive force in the first temperature range and may not have the adhesive force in the second temperature range.

Each of the first to third adhesive sheets AS1, AS2, and AS3 may have long sides extending in the second direction DR2 and short sides extending in the first direction DR1. When viewed from the plane, each of the first to third adhesive sheets AS1, AS2, and AS3 may have a rectangular shape.

The first to third adhesive sheets AS1, AS2, and AS3 may be spaced apart from each other in the first direction DR1. The first to third adhesive sheets AS1, AS2, and AS3 may be disposed on a bottom surface of the third adhesive layer ADL3. Although three adhesive sheets are illustrated in FIG. 8A, this is merely illustrative. The embodiment of the inventive concept is not limited to the number of the adhesive sheets shown in FIG. 8A.

Referring to FIGS. 9A and 9B, a first adhesive layer ADL1-2 of a space layer SPL-2 may include a plurality of adhesive sheets AS1', AS2', AS3', AS4', and AS5'. Each of a first adhesive sheet AS1', a second adhesive sheet AS2', a third adhesive sheet AS3', a fourth adhesive sheet AS4', and a fifth adhesive sheet AS5' may have an adhesive force in the first temperature range and may not have the adhesive force in the second temperature range.

Each of the first adhesive sheet AS1', the second adhesive sheet AS2', the third adhesive sheet AS3', the fourth adhesive sheet AS4', and the fifth adhesive sheet AS5' may have long sides extending in the first direction DR1 and short sides extending in the second direction DR2.

When viewed from the plane, each of the first to fifth adhesive sheets AS1', AS2', AS3', AS4', and AS5' may have a rectangular shape. The first to fifth adhesive sheets AS1', AS2', AS3', AS4', and AS5' may be spaced apart from each other in the second direction DR2. The first to fifth adhesive sheets AS1', AS2', AS3', AS4', and AS5' may be disposed on the bottom surface of the third adhesive layer ADL3. Although five adhesive sheets are illustrated in FIG. 9A, the embodiment of the inventive concept is not limited to the number of the adhesive sheets shown in FIG. 9A.

FIG. 10 is a flowchart representing a method of manufacturing a display panel according to an embodiment of the inventive concept. FIGS. 11 to 15 are views illustrating each of processes in FIG. 10. In FIGS. 11 to 15, each of layers of the display device is turned upside down for convenience of description.

Hereinafter, a method of manufacturing a display panel according to an embodiment of the inventive concept will be described in detail.

Figure 11:
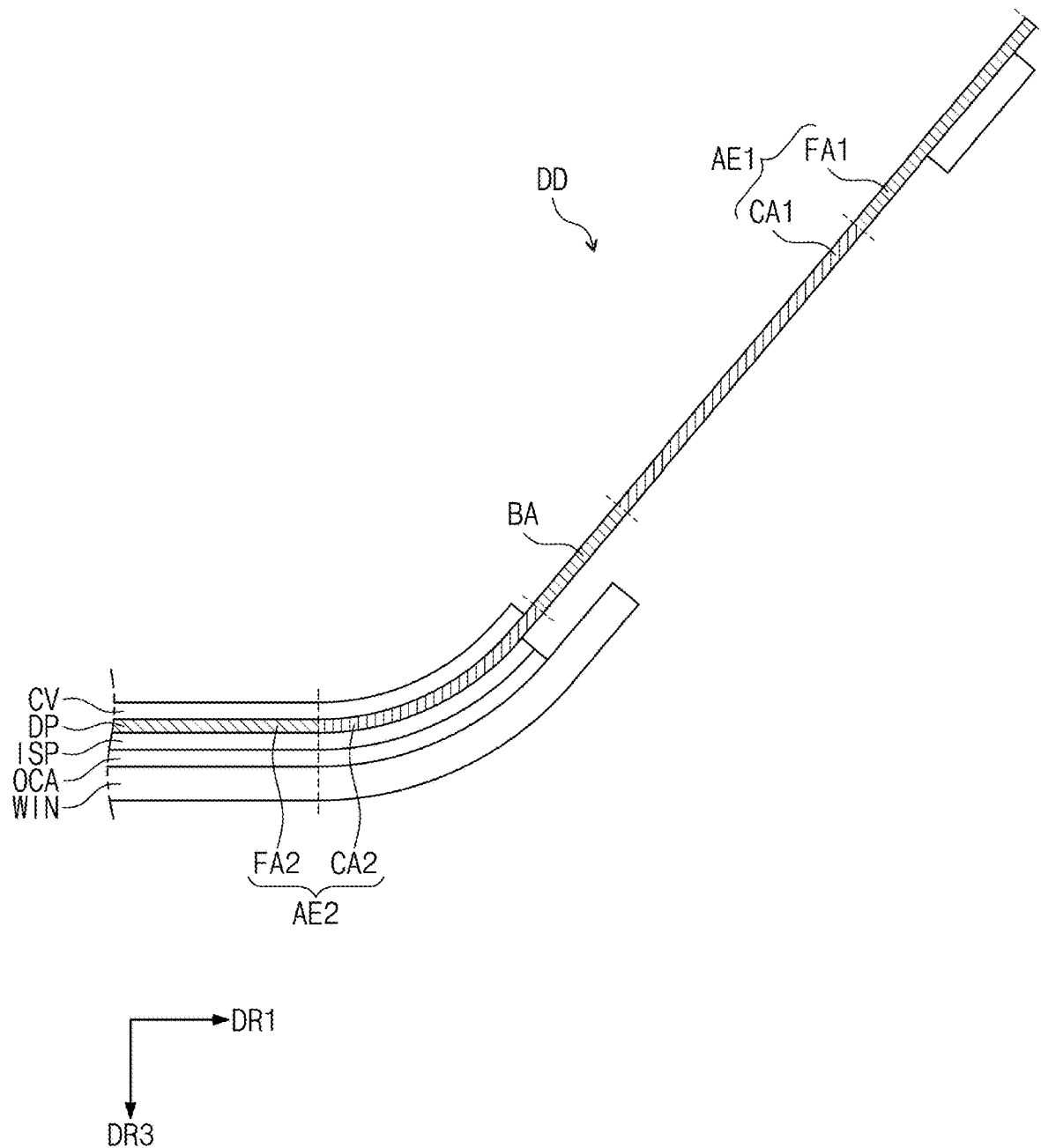
FIGS. 11 to 15 are views illustrating each of processes in FIG. 10.

Referring to FIGS. 10 and 11, a display panel DP may be provided in a process S10. The display panel DP may include a first area AE1, a second area AE2, and a bending area BA disposed between the first area AE1 and the second area AE2. The first area AE1 may include a first curved area CA1 and a first flat area FA1, and the second area AE2 may include a second curved area CA2 and a second flat area FA2. The bending area BA may be disposed between the first curved area CA1 and the second curved area CA2.

According to an embodiment of the inventive concept, a process of arranging the display panel DP on a bottom surface of a window WIN may be further provided before the process S10. Specifically, the second area AE2 of the display panel DP may be fixed to the bottom surface of the window WIN by an adhesive OCA. The window WIN may overlap the second area AE2 and a portion of the bending area BA of the display panel DP.

In a process S20, a cover panel CV may be disposed on the display panel DP. The cover panel CV may be disposed on a bottom surface of the second area AE2. Specifically, the cover panel CV may include a flat portion disposed on the second flat area FA2 and a curved portion disposed on the second curved area CA2.

Figure 12:
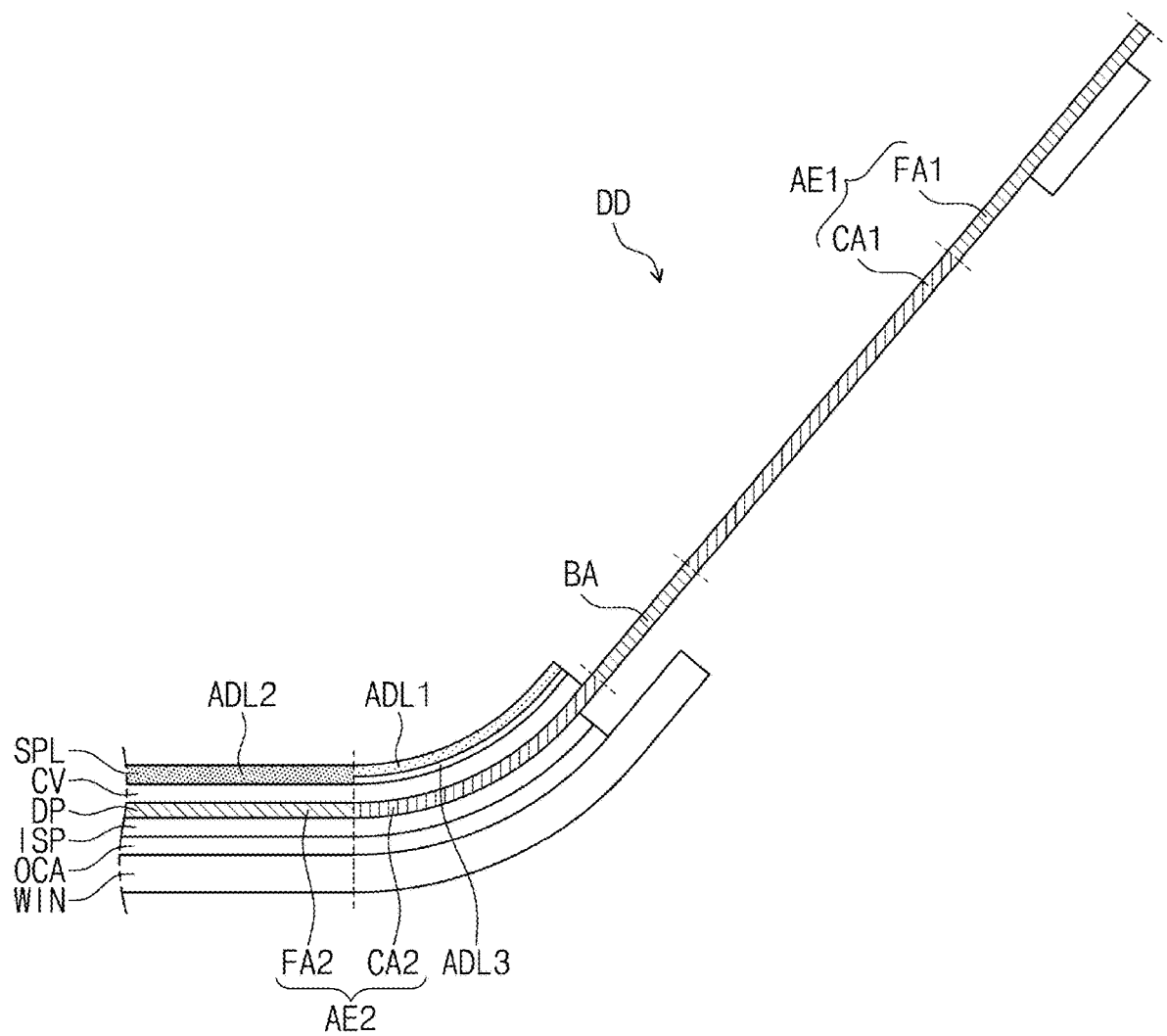

Referring to FIGS. 10 and 12, a space layer SPL may be disposed on the cover panel CV in a process S30. Specifically, the space layer SPL may include a first adhesive layer ADL1, a second adhesive layer ADL2, and a third adhesive layer ADL3. The first adhesive layer ADL1, the second adhesive layer ADL2, and the third adhesive layer ADL3 may be disposed on a bottom surface of the cover panel CV. The second adhesive layer ADL2, and the third adhesive layer ADL3 may be attached to the bottom surface of the cover panel CV, and the first adhesive layer ADL1 may be attached to a bottom surface of the third adhesive layer ADL3.

The first adhesive ADL1 and the third adhesive ADL3 may overlap the second curved area CA2. The second adhesive layer ADL2 may overlap the second flat area FA2. In terms of the third direction DR3, the second adhesive layer ADL2 may have a thickness that is equal to a sum of a thickness of the first adhesive layer ADL1 and a thickness of the third adhesive layer ADL3. As described above, the first adhesive layer ADL1 and the second adhesive layer ADL2 may have different properties from each other.

Figure 13:
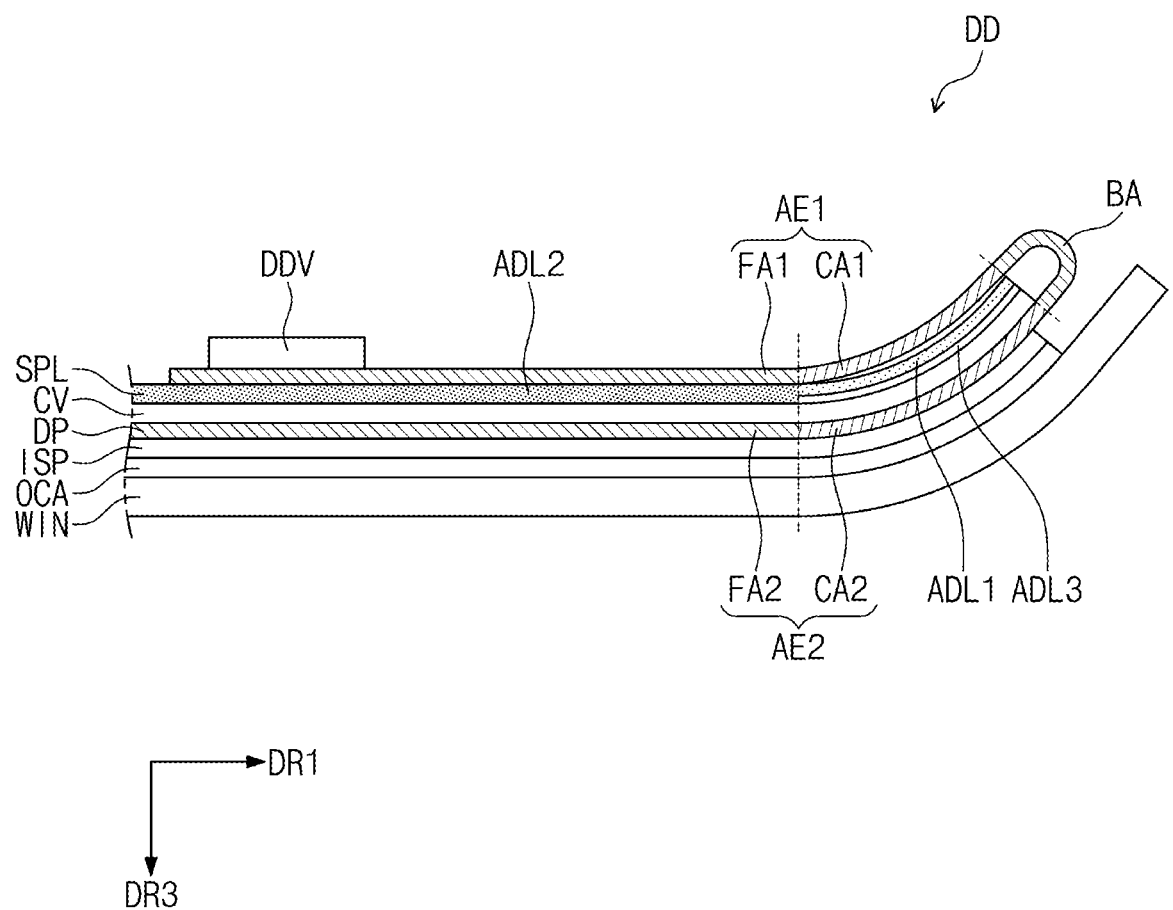

Referring to FIGS. 10 and 13, the bending area BA of the display panel DP may be bent in a process S40. Thus, the first area AE1 of the display panel DP may be disposed on a bottom surface of the space layer SPL. Specifically, the first curved area CA1 may be disposed on a bottom surface of the first adhesive layer ADL1, and the first flat area FA1 may be disposed on a bottom surface of the second adhesive layer ADL2.

In a process S50, the first flat area FA1 may be attached to the bottom surface of the second adhesive layer ADL2. The process S50 may be performed in the second temperature range. For example, the process S50 may be performed in the room temperature. The first flat area FA1 may be disposed in parallel to the second flat area FA2. The first curved area CA1 may be disposed on the first adhesive layer ADL1. The first adhesive layer ADL1 may not have an adhesive force in the second temperature range. Thus, the first curved area CA1 may not be attached to the bottom surface of the first adhesive layer ADL1 in this state.

Figure 14:
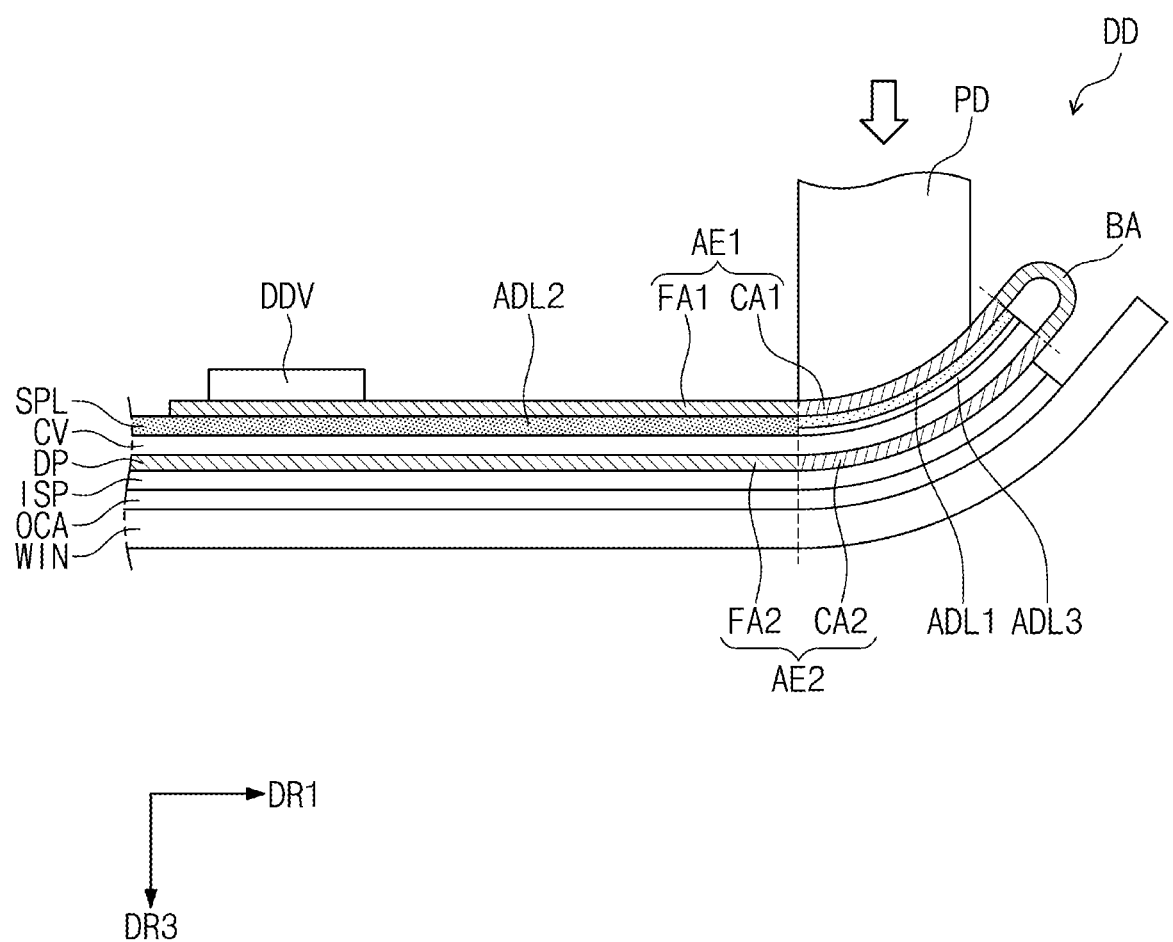

Referring to FIGS. 10 and 14, the first curved area CA1 may be pressed by a pressing pad PD in a process S60. The pressing pad PD may have one surface having a shape corresponding to the first adhesive layer ALD1. The pressing pad PD may move in the third direction DR3. The pressing pad PD may press the first curved area CA1 downward (in view of FIG. 14) while contacting the bottom surface of the first curved area CA1. Thus, a top surface of the first curved area CA1 may contact the bottom surface of the first adhesive layer ADL1. The first curved area CA1 may have a curved shape in correspondence to a shape of the first adhesive layer ADL1.

In a process S70, heat may be applied to the first adhesive layer ADL1. The process S70 may be performed simultaneously with the process S60. For example, the pressing pad PD may press the first curved area CA1 and apply heat to the first curved area CA1 at the same time. The heat applied by the pressing pad PD may be transferred to the first adhesive layer ADL1 through the first curved area CA1. When the first adhesive layer ADL1 is within the first temperature range, the first adhesive layer ADL1 may be melted. Thus, the top surface of the first curved area CA1 may be attached to the melted first adhesive layer ADL1.

After the process S70, the pressing pad PD may move in the third direction DR3 and be spaced apart from the first curved area CA1. The first adhesive layer ADL1 may be cooled again. Although a temperature of the first adhesive layer ADL1 is changed from the first temperature range to the second temperature range, a coupling force between the first adhesive layer ADL1 and the first curved area CA1 already made may be maintained.

Figure 15:
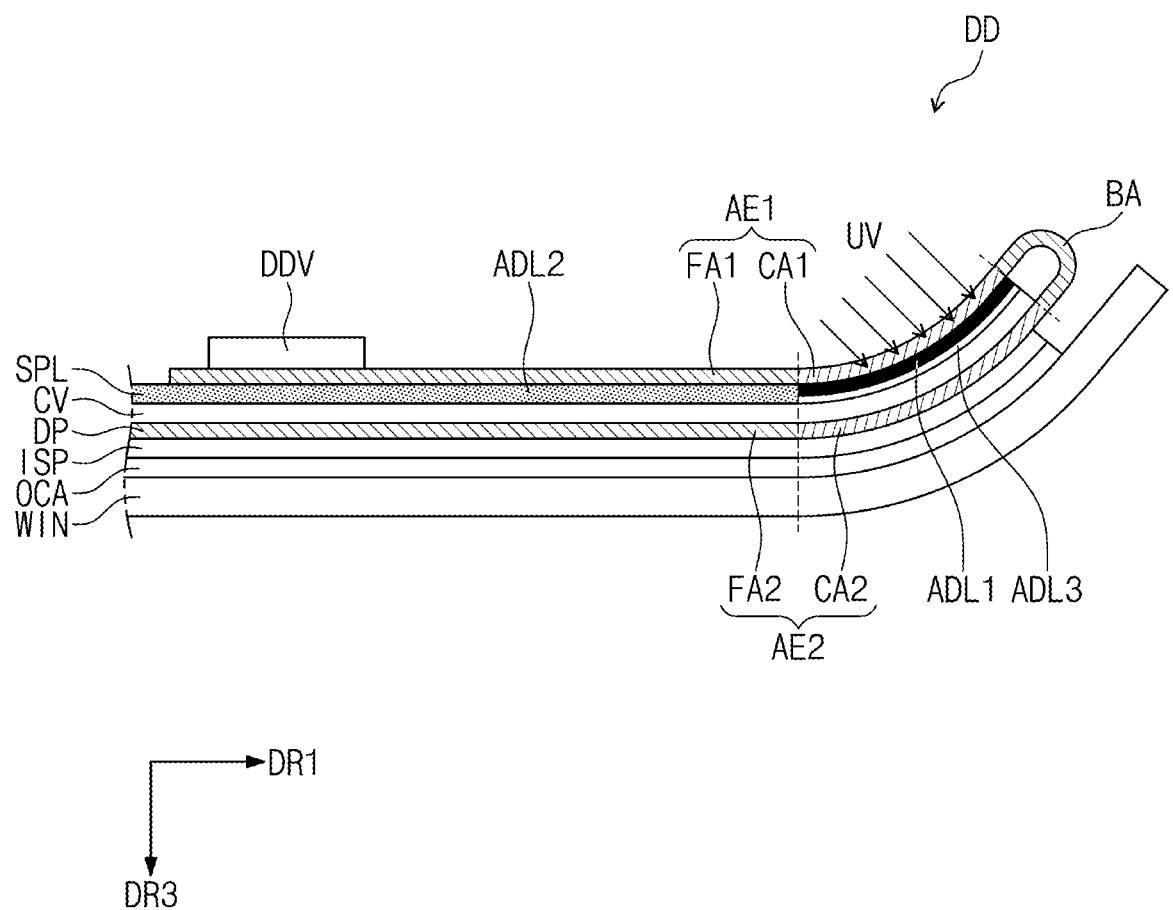

Referring to FIGS. 10 and 15, the first adhesive layer ADL1 may be irradiated with an ultraviolet ray UV in a process S80. The first adhesive layer ADL1 may be cured by the irradiated ultraviolet ray UV. Thus, the first adhesive layer ADL1 and the first curved area CA1 may be further firmly coupled to each other.

According to an embodiment of the inventive concept, since the first adhesive layer ADL1 does not have the adhesive force in the second temperature range, the first flat area FA1 may be attached to the cover panel CV, and then the first curved area CA1 may be attached to the first adhesive layer ADL1 while stably contacting the bottom surface of the cover panel CV through the pressing pad PD. As a result, the first curved area CA1 may be further stably fixed to the cover panel CV by using an adhesive having a different property from the first flat area FA1 to the first curved area CA1 of the display panel DP.

According to an embodiment of the inventive concept, since a typical pressing pad may be used in a manufacturing process by adding only a heat source thereto, typical manufacturing equipment may be used by relatively simply changing the equipment to be economically used.

According to the embodiment of the inventive concept, since the first adhesive layer having an adhesive force within a predetermined range is used, the user may easily deform the shape of the first curved area in correspondence to the first adhesive layer and then attach the first curved area to the first adhesive layer by applying heat. Thus, the curved area of the display panel may be stably fixed to the bottom surface of the cover panel.

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A display device comprising:
   a display panel comprising a first area, a second area disposed on, spaced apart from, and facing the first area, and a bending area, wherein the first area comprises a first flat area and a first curved area disposed between the bending area and the first flat area, a first end of the bending area is directly connected to the first area, and a second end, opposite to the first end, or the bending area is directly connected to the second area;
   a driver disposed on the first flat area;
   a cover panel disposed between the first area and the second area; and
   a space layer comprising a first adhesive layer disposed between the cover panel and the first curved area and a second adhesive layer disposed between the cover panel and the first flat area,
   wherein the first adhesive layer has an adhesive property different from an adhesive property of the second adhesive layer.

2. The display device of claim 1, wherein the second area comprises:
   a second curved area overlapping the first curved area in a plan view; and
   a second flat area overlapping the first flat area in the plan view.

3. The display device of claim 1, wherein the first curved area is attached to the first adhesive layer in a first temperature range, and
   the first flat area is attached to the second adhesive layer in a second temperature range that is different from the first temperature range.

4. The display device of claim 3, wherein a minimum value in the first temperature range is greater than a maximum value in the second temperature range.

5. The display device of claim 1, wherein the first adhesive layer has a same area as the first curved area.

6. The display device of claim 1, wherein the first adhesive layer comprises a plurality of adhesive sheets.

7. The display device of claim 1, wherein the second adhesive layer comprises:
   a first adhesive tape which contact the cover panel;
   a second adhesive tape which contact the first flat area; and
   a spacer disposed between the first adhesive tape and the second adhesive tape.

8. The display device of claim 1, wherein the space layer further comprises a third adhesive layer disposed between the first adhesive layer and the cover panel.

9. The display device of claim 1, wherein the display panel further comprises:
   a flexible substrate;
   a circuit element layer disposed on the flexible substrate;
   a display element layer disposed on the circuit element layer; and
   a thin-film encapsulation layer disposed on the display element layer,
   wherein the display element layer overlaps the second area in the plan view.

10. The display device of claim 9, wherein the display panel further comprises a protection layer disposed on the bending area.

11. The display device of claim 9, wherein the display panel further comprises a protection substrate disposed below the substrate and overlapping the first area and the second area.

12. The display device of claim 1, further comprising a window disposed on the display panel,
   wherein the window is disposed to cover the second area and the bending area.

* * * * *